United States Patent
Wang et al.

(10) Patent No.: US 10,621,408 B2
(45) Date of Patent: Apr. 14, 2020

(54) FINGERPRINT DETECTION CIRCUIT, DETECTION METHOD FOR FINGERPRINT DETECTION CIRCUIT, AND FINGERPRINT SENSOR

(71) Applicant: BOE TECHNOLOGY GROUP CO., LTD., Beijing (CN)

(72) Inventors: Pengpeng Wang, Beijing (CN); Haisheng Wang, Beijing (CN); Xiaoliang Ding, Beijing (CN); Chihjen Cheng, Beijing (CN); Yanling Han, Beijing (CN); Wei Liu, Beijing (CN); Xueyou Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 124 days.

(21) Appl. No.: 16/040,516

(22) Filed: Jul. 19, 2018

(65) Prior Publication Data

US 2019/0087626 A1     Mar. 21, 2019

(30) Foreign Application Priority Data

Sep. 15, 2017   (CN) .......................... 2017 1 0835414

(51) Int. Cl.
*G06K 9/00* (2006.01)
*G06F 3/03* (2006.01)
*H01L 31/0224* (2006.01)
*H01L 29/423* (2006.01)
*G06F 3/042* (2006.01)

(52) U.S. Cl.
CPC .......... *G06K 9/0004* (2013.01); *G06F 3/0304* (2013.01); *G06F 3/042* (2013.01); *H01L 29/42356* (2013.01); *H01L 31/0224* (2013.01)

(58) Field of Classification Search
CPC ..... G06K 9/0004; G06F 3/042; G06F 3/0304; H01L 29/42356; H01L 31/0224
See application file for complete search history.

(56) References Cited

U.S. PATENT DOCUMENTS

| 9,658,710 B2* | 5/2017 | Yang ......................... G09G 3/32 |
| 2010/0097334 A1* | 4/2010 | Choi ....................... G06F 3/0412 |
| | | 345/173 |
| 2011/0001711 A1* | 1/2011 | Choi ....................... G06F 3/0412 |
| | | 345/173 |

(Continued)

*Primary Examiner* — John B Strege
(74) *Attorney, Agent, or Firm* — Kinney & Lange, P.A.

(57) ABSTRACT

A fingerprint detection circuit is provided, which includes a photosensitive unit, a voltage following transistor, a first switching transistor and a second switching transistor. A gate electrode of the first switching transistor is connected to a first resetting control end, a first electrode thereof is connected to a node, and a second electrode thereof is connected to a second electrode of the voltage following transistor. A gate electrode of the second switching transistor is connected to a scanning signal end, a first electrode thereof is connected to the second electrode of the voltage following transistor, and a second electrode thereof is connected to a first reference voltage end. A gate electrode of the voltage following transistor is connected to the node. A first electrode of the photosensitive unit is connected to a third reference voltage end, and a second electrode thereof is connected to the node.

20 Claims, 7 Drawing Sheets

(56) References Cited

U.S. PATENT DOCUMENTS

2013/0063398 A1* 3/2013 Ko ........................ G06F 3/042
 345/175
2016/0246424 A1* 8/2016 Yang .................... G06F 3/0412
2018/0300527 A1* 10/2018 Wang .................... G06F 3/0421
2018/0356291 A1* 12/2018 Mainguet ................. G01J 5/34

* cited by examiner

FINGERPRINT DETECTION CIRCUIT, DETECTION METHOD FOR FINGERPRINT DETECTION CIRCUIT, AND FINGERPRINT SENSOR

CROSS-REFERENCE TO RELATED APPLICATION

The present application claims a priority of the Chinese patent application No. 201710835414.X filed on Sep. 15, 2017, which is incorporated herein by reference in its entirety.

TECHNICAL FIELD

The present disclosure relates to the field of fingerprint identification technology, in particular to a fingerprint detection circuit, a detection method for the fingerprint detection circuit, and a fingerprint sensor.

BACKGROUND

Optical fingerprint sensors have been widely used due to such an advantage as long-distance sensing. In addition, in order to reduce the noise contained in a fingerprint detection result, typically fingerprint detection is performed by the optical fingerprint sensor through an active detection circuit for detecting a voltage.

Typically, the active fingerprint detection circuit in the related art includes a first switching transistor, a photodiode connected in series with the first switching transistor, a voltage following transistor, and a second switching transistor connected in series with the voltage following transistor. During operation, the first switching transistor is turned on, so as to reset a gate voltage of the voltage following transistor. The gate voltage, which varies due to irradiation of the photodiode, is then outputted to a columnwise output bus via a source electrode of the voltage following transistor and the second switching transistor in an on state, so as to acquire fingerprint data.

However, for a glass-based amorphous silicon process or a low-temperature poly-silicon process, the voltage following transistor in the active fingerprint detection circuit is a thin film transistor (TFT). Due to the characteristics of the TFT itself, a threshold voltage drift may occur for the TFT with the elapse of time, so a following effect of the voltage following transistor is non-ideal. Hence, a drift may occur for output data of the active fingerprint detection circuit, and it may be impossible for the active fingerprint detection circuit to detect a fingerprint normally.

SUMMARY

In view of the above, the present disclosure provides a fingerprint detection circuit, a detection method for the fingerprint detection circuit, and a fingerprint sensor.

In one aspect, the present disclosure provides in some embodiments a fingerprint detection circuit, including a scanning signal end, a signal output end, a photosensitive unit, a voltage following transistor, a first switching transistor and a second switching transistor. A gate electrode of the first switching transistor is connected to a first resetting control end, a first electrode thereof is connected to a node, and a second electrode thereof is connected to a second electrode of the voltage following transistor. A gate electrode of the second switching transistor is connected to the scanning signal end, a first electrode thereof is connected to the second electrode of the voltage following transistor, and a second electrode thereof is connected to a first reference voltage end. A gate electrode of the voltage following transistor is connected to the node, and a first electrode thereof is connected to the signal output end, and connected to a second reference voltage end via a current source. A first electrode of the photosensitive unit is connected to a third reference voltage end, and a second electrode thereof is connected to the node.

In a possible embodiment of the present disclosure, the fingerprint detection circuit further includes a third switching transistor, a gate electrode of which is connected to a second resetting control end, a first electrode of which is connected to a fourth reference voltage end, and a second electrode of which is connected to the node.

In a possible embodiment of the present disclosure, the fingerprint detection circuit further includes a fourth switching transistor and/or a fifth switching transistor. A gate electrode of the fourth switching transistor is connected to a third resetting control end, and a second electrode thereof is connected to the first electrode of the voltage following transistor. The first electrode of the voltage following transistor is connected to the signal output end via a first electrode of the fourth switching transistor, and the first electrode of the fourth switching transistor serves as the first electrode of the voltage following transistor. A gate electrode of the fifth switching transistor is connected to a fourth resetting control end, a first electrode thereof is connected to the first electrode of the voltage following transistor, and a second electrode thereof is connected to a fifth reference voltage end.

In another aspect, the present disclosure provides in some embodiments a fingerprint sensor including the above-mentioned fingerprint detection circuit.

In yet another aspect, the present disclosure provides in some embodiments a fingerprint sensor, including a plurality of pixel units arranged in an array form. Each of the pixel units includes the above-mentioned fingerprint detection circuit.

In still yet another aspect, the present disclosure provides in some embodiments a detection method for use in the above-mentioned fingerprint detection circuit, the voltage following transistor being a P-channel transistor. The detection method includes steps of: enabling the first switching transistor to be turned on under the control of the first resetting control end; enabling the second switching transistor to be turned off under the control of the scanning signal end; applying a first predetermined voltage, which is greater than a sum of a voltage applied to the node and a threshold voltage of the voltage following transistor, to the first electrode of the voltage following transistor, so as to turn on the voltage following transistor for the first time and enable the first electrode of the voltage following transistor to charge the node via the first switching transistor until the voltage following transistor is turned off and the voltage applied to the node is equal to a difference between the first predetermined voltage and the threshold voltage of the voltage following transistor; enabling the first switching transistor to be turned off under the control of the first resetting control end, so as to enable the voltage applied to the node to be reduced by irradiating the photosensitive unit; and enabling the second switching transistor to be turned on under the control of the scanning signal end, so as to enable the voltage following transistor to be turned on for the second time and turn on the current source, thereby to enable the second electrode of the voltage following transistor to output a voltage signal independent of the threshold voltage of the voltage following transistor to the signal output end.

In a possible embodiment of the present disclosure, the fingerprint detection circuit further includes a third switching transistor, a gate electrode of which is connected to the second resetting control end, a first electrode of which is connected to the fourth reference voltage end, and a second electrode of which is connected to the node. Prior to the step of enabling the first switching transistor to be turned on under the control of the first resetting control end, the detection method further includes: enabling the third switching transistor to be turned on under the control of the second resetting control end, so as to enable the voltage applied to the node to be equal to a reference voltage from the fourth reference voltage end. The reference voltage from the fourth reference voltage end is smaller than a difference between the first predetermined voltage and the threshold voltage of the voltage following transistor.

In a possible embodiment of the present disclosure, the fingerprint detection circuit further includes a fourth switching transistor, a gate electrode of which is connected to the third resetting control end, and a second electrode of which is connected to the first electrode of the voltage following transistor. The first electrode of the voltage following transistor is connected to the signal output end via a first electrode of the fourth switching transistor, and the first electrode of the fourth switching transistor serves as the first electrode of the voltage following transistor. Subsequent to the step of enabling the first switching transistor is turned on under the control of the first resetting control end, the detection method further includes: enabling the fourth switching transistor to be turned on under the control of the third resetting control end. Subsequent to the step of applying the first predetermined voltage, which is greater than the sum of the voltage applied to the node and the threshold voltage of the voltage following transistor, to the first electrode of the voltage following transistor, so as to turn on the voltage following transistor for the first time and enable the first electrode of the voltage following transistor to charge the node via the first switching transistor until the voltage following transistor is turned off and the voltage applied to the node is equal to the difference between the first predetermined voltage and the threshold voltage of the voltage following transistor, the detection method further includes: enabling the fourth switching transistor to be turned off under the control of the third resetting control end. The step of enabling the second switching transistor to be turned on under the control of the scanning signal end, so as to enable the voltage following transistor to be turned on for the second time and turn on the current source, thereby to enable the second electrode of the voltage following transistor to output a voltage signal independent of the threshold voltage of the voltage following transistor to the signal output end, includes: enabling the second switching transistor to be turned on under the control of the scanning signal end for a predetermined time period, and enabling the fourth switching transistor to be turned on under the control of the third resetting control end, so as to enable the voltage following transistor to be turned on for the second time and turn on the current source, thereby to enable the second electrode of the voltage following transistor to output the voltage signal independent of the threshold voltage of the voltage following transistor to the signal output end.

In a possible embodiment of the present disclosure, the fingerprint detection circuit further includes a fifth switching transistor, a gate electrode of which is connected to the fourth resetting control end, a first electrode of which is connected to the first electrode of the voltage following transistor, and a second electrode of which is connected to the fifth reference voltage end. The step of applying the first predetermined voltage, which is greater than a sum of a voltage applied to the node and a threshold voltage of the voltage following transistor, to the first electrode of the voltage following transistor, so as to turn on the voltage following transistor for the first time and enable the first electrode of the voltage following transistor to charge the node via the first switching transistor until the voltage following transistor is turned off and the voltage applied to the node is equal to a difference between the first predetermined voltage and the threshold voltage of the voltage following transistor, includes: enabling the fifth switching transistor to be turned on under the control of the fourth resetting control end, wherein a reference voltage from the fifth reference voltage end is equal to the first predetermined voltage, so as to turn on the voltage following transistor for the first time and enable the first electrode of the voltage following transistor to charge the node via the first switching transistor until the voltage following transistor is turned off and the voltage applied to the node is equal to the difference between the first predetermined voltage and the threshold voltage of the voltage following transistor.

In still yet another aspect, the present disclosure provides in some embodiments a detection method for use in the above-mentioned fingerprint detection circuit, the voltage following transistor being an N-channel transistor. The detection method includes steps of: enabling the first switching transistor to be turned on under the control of the first resetting control end; enabling the second switching transistor to be turned off under the control of the scanning signal end; applying a second predetermined voltage, which is smaller than a sum of a voltage applied to the node and a threshold voltage of the voltage following transistor, to the first electrode of the voltage following transistor, so as to turn on the voltage following transistor for the first time and enable the node to charge the first electrode of the voltage following transistor via the first switching transistor until the voltage following transistor is turned off and the voltage applied to the node is equal to a sum of the second predetermined voltage and the threshold voltage of the voltage following transistor; enabling the first switching transistor to be turned off under the control of the first resetting control end, so as to enable the voltage applied to the node to be increased by irradiating the photosensitive unit; and enabling the second switching transistor to be turned on under the control of the scanning signal end, so as to enable the voltage following transistor to be turned on for the second time and turn on the current source, thereby to enable the second electrode of the voltage following transistor to output a voltage signal independent of the threshold voltage of the voltage following transistor to the signal output end.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain other drawings without any creative effort.

DETAILED DESCRIPTION OF EMBODIMENTS

In order to make the technical means and advantages more apparent, the structures, the features and the advantages of the fingerprint detection circuit, the detection method for the fingerprint detection circuit, and the fingerprint sensor of the present disclosure will be described hereinafter in conjunction with the drawings and embodiments. In the following description, such words as "one embodiment" or "an embodiment" may not necessarily refer to an identical embodiment. In addition, the specific features, structures or characteristics in one or more embodiments may be combined in any appropriate form.

Figure 1:
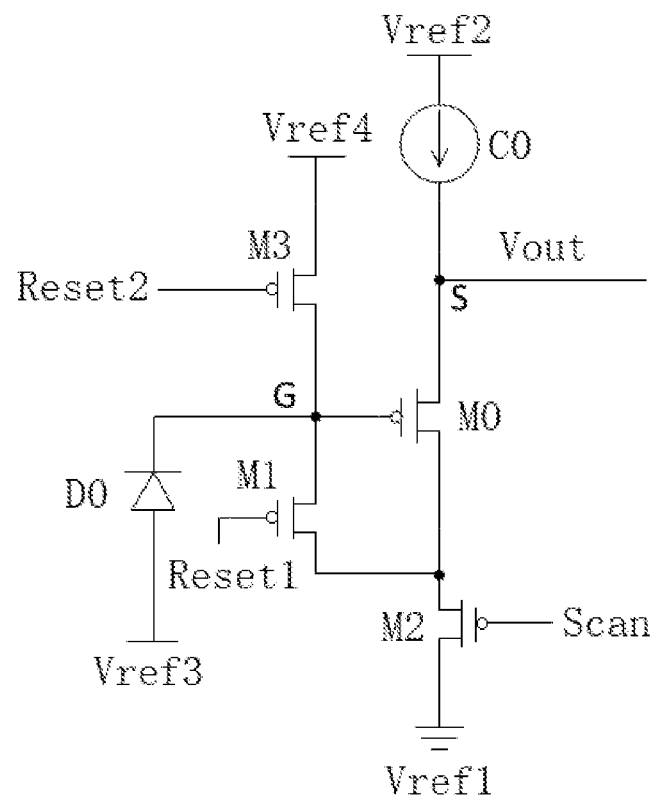
FIG. 1 is a schematic view showing a fingerprint detection circuit according to one embodiment of the present disclosure.

As shown in FIG. 1, the present disclosure provides in some embodiments a fingerprint detection circuit, which includes a scanning signal end Scan, a signal output end Vout, a photosensitive unit DO, a voltage following transistor M0, a first switching transistor M1 and a second switching transistor M2. A gate electrode of the first switching transistor M1 is connected to a first resetting control end Reset1, a first electrode thereof is connected to a node G, and a second electrode thereof is connected to a second electrode of the voltage following transistor M0. A gate electrode of the second switching transistor M2 is connected to the scanning signal end Scam, a first electrode thereof is connected to the second electrode of the voltage following transistor M0, and a second electrode thereof is connected to a first reference voltage end Vref1. A gate electrode of the voltage following transistor M0 is connected to the node G, and a first electrode thereof is connected to the signal output end Vout and connected to a second reference voltage end Vref2 via a current source C0. A first electrode of the photosensitive unit DO is connected to a third reference voltage end Vref3, and a second electrode thereof is connected to the node G.

In the fingerprint detection circuit, the photosensitive diode DO may be a photodiode. The voltage following transistor M0, the first switching transistor M1 and the second switching transistor M2 may each be a P-channel transistor or an N-channel transistor. In the case that the voltage following transistor M0, the first switching transistor M1 and the second switching transistor M2 are all P-channel transistors, an anode of the photodiode DO may be connected to the third reference voltage end Vref3, and a cathode thereof may be connected to the node G. A potential at the node G shall be greater than a first reference voltage from the third reference voltage end Vref3, so as to provide a reverse-biased photodiode. At this time, a detection procedure of the fingerprint detection circuit may include the following stages, where $V_{th}$ represents a threshold voltage of the voltage following transistor M0, and $V_G$ represents a voltage applied to the node G.

At a first stage, the first switching transistor M1 may be turned on under the control of the first resetting control end Reset1, and the second switching transistor M2 may be turned off under the control of the scanning signal end Scan. Then, a predetermined voltage $V_{data}$ may be applied to the first electrode of the voltage following transistor M0. The predetermined voltage $V_{data}$ may be greater than a sum of the voltage applied to the node G and the threshold voltage $V_{th}$ of the voltage following transistor M0, so as to enable the voltage following transistor M0 to be turned on. At this time, the voltage following transistor M0 may be turned on for the first time, and the node G may be charged by the first electrode of the voltage following transistor M0 via the first switching transistor M1 until the voltage following transistor M0 is turned off due to a condition of the voltage following transistor M0 of being incapable of being turning on and the voltage $V_G$ applied to the node G is equal to a difference between the predetermined voltage $V_{data}$ and the threshold voltage $V_{th}$ of the voltage following transistor M0, i.e., $V_G = V_{data} - V_{th}$. The predetermined voltage may be applied by an integrated circuit (IC) connected to the signal output end Vout of the fingerprint detection circuit.

At a second stage, the first switching transistor M1 may be turned off under the control of the first resetting control end Reset1. At this time, after the photodiode is irradiated by light beams reflected by valleys and ridges of a fingerprint, the potential at the node G may be reduced by $\Delta S$, i.e., $V_G = V_{data} - V_{th} - \Delta S$.

Figure 4:
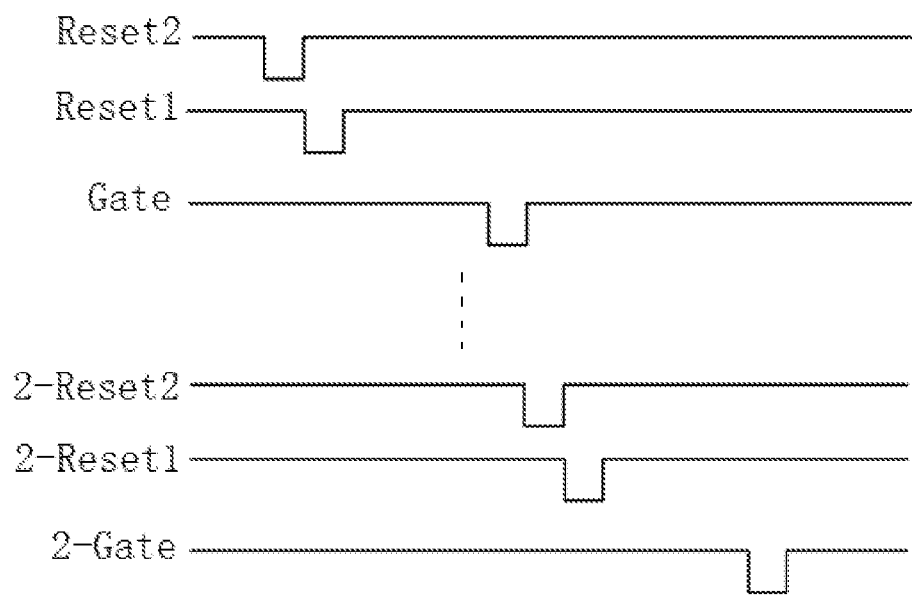
FIG. 4 is a sequence diagram of the fingerprint detection circuit according to one embodiment of the present disclosure.

At a third stage, the second switching transistor M2 may be turned on under the control of the scanning signal end Scan. At this time, because the potential $V_G$ at the node G is reduced, so the voltage following transistor M0 may be turned on for the second time, so as to form a conductive path through the current source C0, the voltage following transistor M0 and the second switching transistor M2. The first electrode of the voltage following transistor M0 may output a voltage signal $V_S$, i.e., a photosensitive signal voltage of the photodiode. On the basis of the formulae $V_S - V_G \approx V_{th} + K_1$ and $V_S - (V_{data} - V_{th} - \Delta S) \approx V_{th} + K$, it may be deduced that $V_S \approx V_{data} - \Delta S + K$, where $K_1$ is a constant. Hence, the voltage signal $V_S$ from the first electrode of the voltage following transistor M0 is merely related to the potential change $\Delta S$ at the node G, but independent of the threshold voltage $V_{th}$ of the voltage following transistor M0. As a result, it is able to eliminate the influence caused by a threshold voltage drift of the voltage following transistor M0, prevent the occurrence of a drift for output data from the fingerprint detection circuit, and increase a signal-to-noise ratio of the output signal, thereby to enable the fingerprint detection circuit to detect the fingerprint normally. FIG. 4 is a sequence diagram of the fingerprint detection circuit, where Reset1, Reset2 and Gate relate to the sequence for the fingerprint detection circuit in a first row in a sensor array, and 2-Reset1, 2-Reset2 and 2-Gate relate to the sequence for the fingerprint detection circuit in a last row in the sensor array. The sequence for the fingerprint detection circuit in each of intermediate rows in the sensor array may be arranged analogous to the sequence for the fingerprint detection circuit in the first row and the sequence for the fingerprint detection circuit in the last row. In this way, it is able to perform a scanning operation progressively in a row-by row manner or simultaneously.

In the case that the voltage following transistor M0, the first switching transistor M1 and the second switching transistor M2 are all N-channel transistors, as shown in FIG. 1, the cathode of the photodiode may be connected to the third reference voltage end Vref3, and the anode thereof may be connected to the node G. The potential at the node G shall be smaller than a second reference voltage from the third reference voltage end Vref3, so as to provide a reverse-biased photodiode. In addition, the reference voltages applied respectively to two ends of each conductive path may be replaced with each other. At this time, the detection procedure of the fingerprint detection circuit may include the following stages, where $V_{th}$ represents the threshold voltage of the voltage following transistor M0, and $V_G$ represents the voltage applied to the node G.

At a first stage, the first switching transistor M1 may be turned on under the control of the first resetting control end Reset1, and the second switching transistor M2 may be turned off under the control of the scanning signal end Scan. Then, a predetermined voltage $V_{data}$ may be applied to the first electrode of the voltage following transistor M0. The predetermined voltage $V_{data}$ may be smaller than a sum of the voltage applied to the node G and the threshold voltage $V_{th}$ of the voltage following transistor M0, so as to enable the voltage following transistor M0 to be turned on. At this time, the voltage following transistor M0 may be turned on for the first time, and the first electrode of the voltage following transistor M0 may be charged by the node G via the first switching transistor M1 until the voltage following transistor M1 is turned off due to a condition of the voltage following transistor M0 of being incapable of being turning on and the voltage $V_G$ applied to the node G is equal to a sum of the predetermined voltage $V_{data}$ and the threshold voltage $V_{th}$ of the voltage following transistor M0, i.e., $V_G=V_{data}+V_{th}$. The predetermined voltage may be applied by the IC connected to the signal output end Vout of the fingerprint detection circuit.

At a second stage, the first switching transistor M1 may be turned off under the control of the first resetting control end Reset1. At this time, after the photodiode is irradiated by light beams reflected by the valleys and ridges of the fingerprint, the potential at the node G may be increased by $\Delta S$, i.e., $V_G=V_{data}+V_{th}+\Delta S$.

At a third stage, the second switching transistor M2 may be turned on under the control of the scanning signal end Scan. At this time, because the potential $V_G$ at the node G is increased, so the voltage following transistor M0 may be turned on for the second time, so as to form a conductive path through the current source C0, the voltage following transistor M0 and the second switching transistor M2. The first electrode of the voltage following transistor M0 may output a voltage signal $V_S$, i.e., a photosensitive signal voltage of the photodiode. On the basis of the formulae $V_G-V_S \approx V_{th}+K_2$ and $(V_{data}+V_{th}+\Delta S)-V_S \approx V_{th}+K_2$, it may be deduced that $V_S \approx V_{data}+\Delta S-K_2$, where $K$, is a constant. Hence, the voltage signal $V_S$ from the first electrode of the voltage following transistor M0 is merely related to the potential change $\Delta S$ at the node G, but independent of the threshold voltage $V_{th}$ of the voltage following transistor M0. As a result, it is able to eliminate the influence caused by a threshold voltage drift of the voltage following transistor M0, prevent the occurrence of a drift for output data from the fingerprint detection circuit, and increase a signal-to-noise ratio of the output signal, thereby to enable the fingerprint detection circuit to detect the fingerprint normally. It may refer to FIG. 4 which is a sequence diagram of the fingerprint detection circuit, merely with the necessity to replace a low level with a high level.

According to the embodiments of the present disclosure, the gate electrode of the first switching transistor is connected to the first resetting control end, the first electrode thereof is connected to the node, and the second electrode thereof is connected to the second electrode of the voltage following transistor. The gate electrode of the second switching transistor is connected to the scanning signal end of the fingerprint detection circuit, the first electrode thereof is connected to the second electrode of the voltage following transistor, and the second electrode thereof is connected to the first reference voltage end. The gate electrode of the voltage following transistor is connected to the node, and the first electrode thereof is connected to the signal output end of the fingerprint detection circuit and connected to the second reference voltage end via the current source. The first electrode of the photosensitive unit is connected to the third reference voltage end, and the second electrode thereof is connected to the node. In the case that the first switching transistor is turned on, the second switching transistor is turned off and the predetermined voltage is applied to the first electrode of the voltage following transistor, it is able to turn on the voltage following transistor, and enable the first electrode of the voltage following transistor to charge the node through the first switching transistor or enable the node to charge the first electrode of the voltage following transistor through the first switching transistor until the voltage following transistor is turned off and the voltage applied to the node is reset to a value related to the threshold voltage of the voltage following transistor. As a result, it enables the first electrode of the voltage following transistor to output a voltage signal independent of its threshold voltage, provide an ideal following effect of the voltage following transistor, prevent the occurrence of the drift for the output data from the fingerprint detection circuit and increase the signal-to-noise ratio of the output signal, thereby to enable the fingerprint detection circuit to detect the fingerprint normally.

In order to provide a more stable detection result of the fingerprint detection circuit, the fingerprint detection circuit may further include a voltage regulation capacitor (not shown) connected between the node G and the first reference voltage end Vref1. Through the voltage regulation capacitor, it is able to stabilize the voltage applied to the node G to be $V_{data}-V_{th}$ or $V_{data}+V_{th}$ at the first stage, so as to prepare for the subsequent elimination of the influence caused by the threshold voltage drift of the voltage following transistor M0. In this way, it is able to further improve the following effect of the voltage following transistor M0, increase the signal-to-noise ratio of the output signal, and provide a more stable detection result of the fingerprint detection circuit, thereby to enable the fingerprint detection circuit to detect the fingerprint in a better manner.

Figure 2:
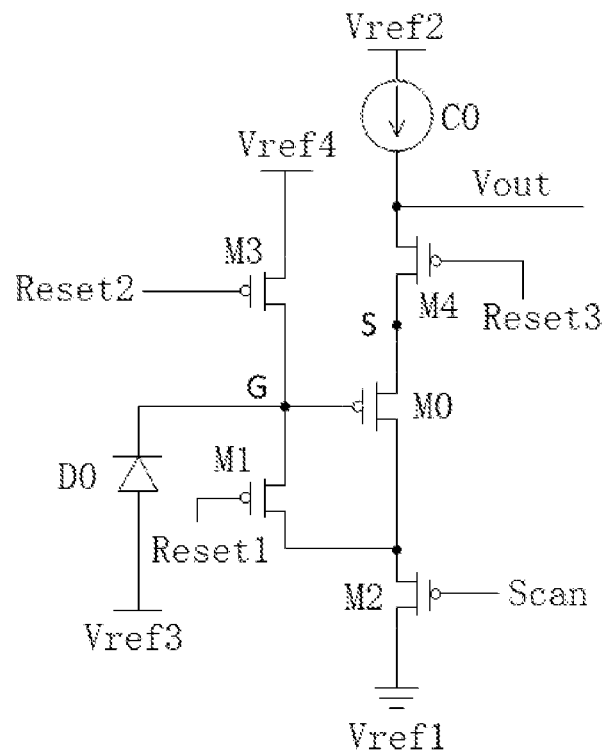
FIG. 2 is a schematic view showing another fingerprint detection circuit according to one embodiment of the present disclosure.
Figure 3:
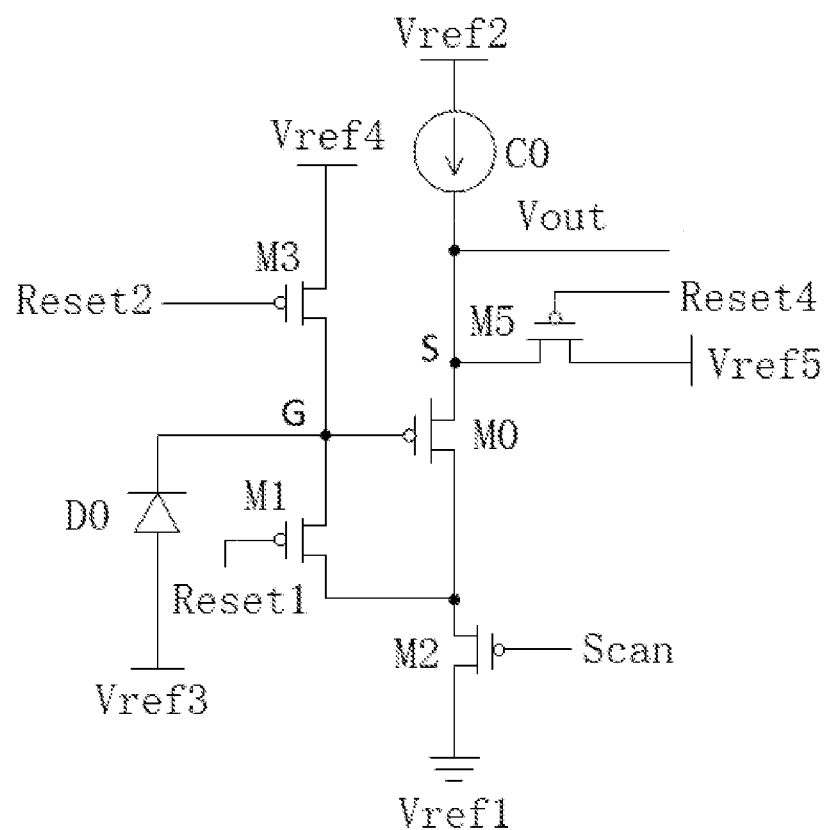
FIG. 3 is a schematic view showing yet another fingerprint detection circuit according to one embodiment of the present disclosure.

As mentioned above, at the first stage, in the case that the predetermined voltage $V_{data}$ is applied to the first electrode of the voltage following transistor M0, the predetermined voltage $V_{data}$ shall be greater than or smaller than the sum of the voltage applied to the node G and the threshold voltage $V_{th}$ of the voltage following transistor M0. In order to pull up or down the potential at the node G rapidly to satisfy the requirement and increase the working efficiency of the fingerprint detection circuit, as shown in FIG. 1, 2 or 3, the fingerprint detection circuit may further include a third switching transistor M3, a gate electrode of which is connected to a second resetting control end Reset2, a first electrode of which is connected to a fourth reference voltage end Vref4, and a second electrode of which is connected to the node G. Through the arrangement of the third switching transistor M3, in the case that the voltage following transistor M0, the first switching transistor M1 and the second switching transistor M2 are all P-channel transistor, the detection procedure of the fingerprint detection circuit may further include, prior to the first stage, an additional stage where the third switching transistor may be turned on under the control of the second resetting control end so as to rapidly change the potential at the node G to be equal to the first reference voltage from the fourth reference voltage end Vref4. The first reference voltage from the fourth reference voltage end Vref4 shall meet such a condition that the predetermined voltage $V_{data}$ is greater than a sum of the first reference voltage from the fourth reference voltage end Vref4 and the threshold voltage $V_{th}$ of the voltage following transistor M0. In this way, it is able to rapidly cause the predetermined voltage $V_{data}$ to be greater than the sum of the voltage applied to the node G and the threshold voltage $V_{th}$ of the voltage following transistor M0, thereby to rapidly turn on the voltage following transistor M0. Identically, in the case that the voltage following transistor M0, the first switching transistor M1 and the second switching transistor M2 are all N-channel transistors, the detection procedure may further include, prior to the first stage, an additional stage where the third switching transistor may be turned on under the control of the second resetting control end so as to enable the potential at the node G to be equal to a second reference voltage from the fourth reference voltage end Vref4. The second reference voltage from the fourth reference voltage end Vref4 shall meet such a condition that the predetermined voltage $V_{data}$ is smaller than a sum of the second reference voltage from the fourth reference voltage end Vref4 and the threshold voltage $V_{th}$ of the voltage following transistor M0. In this way, it is able to rapidly cause the predetermined voltage $V_{data}$ to be smaller than the sum of the voltage applied to the node G and the threshold voltage $V_{th}$ of the voltage following transistor M0, thereby to rapidly turn on the voltage following transistor M0 and improve the working efficiency of the fingerprint detection circuit. FIG. 4 shows the sequence diagram of the fingerprint detection circuit.

Figure 5:
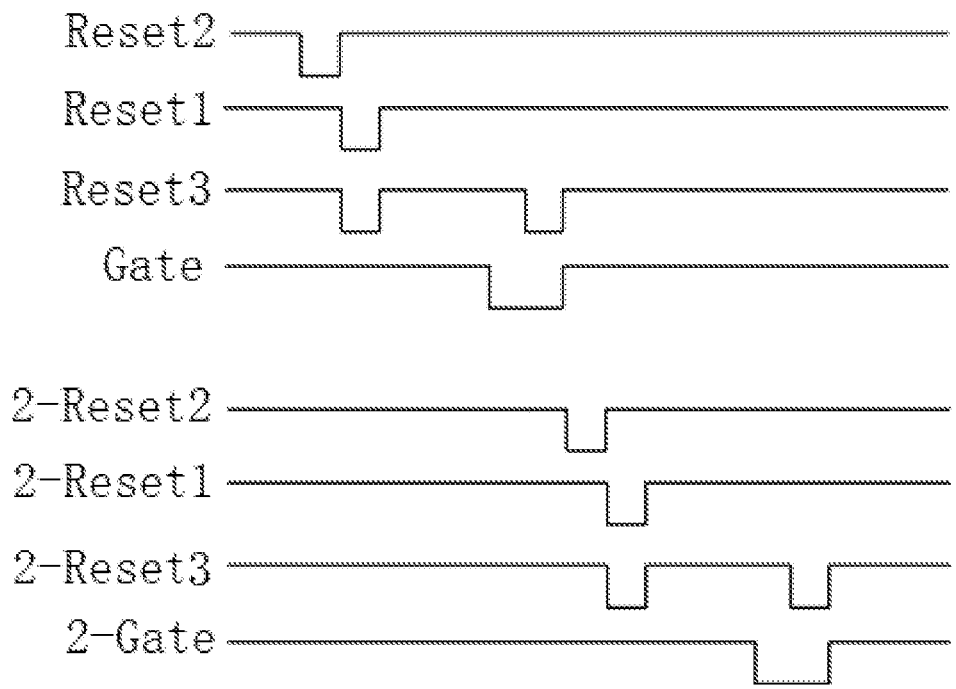
FIG. 5 is another sequence diagram of the fingerprint detection circuit according to one embodiment of the present disclosure.

At the third stage, the second switching transistor M2 may be turned on upon the receipt of a clock signal from the scanning signal end Scan connected to the gate electrode of the second switching transistor M2. At this time, a clock feed-through effect may easily occur for the second switching transistor M2, so the clock signal may probably be coupled to the first electrode of the second switching transistor M2, and thereby to the first electrode of the voltage following transistor M0 via the first electrode of the second switching transistor M2. Hence, the output signal from the first electrode of the voltage following transistor M0 may be adversely affected. In order to prevent the output signal from being adversely affected by the clock feed-through effect occurring for the second switching transistor M2, further increase the signal-to-noise ratio of the output signal and enable the fingerprint detection circuit to detect the fingerprint in a better manner, as shown in FIG. 2, the fingerprint detection circuit may further include a fourth switching transistor M4, a gate electrode of which is connected to a third resetting control end Reset3 and a second electrode of which is connected to the first electrode of the voltage following transistor M0. The first electrode of the voltage following transistor M0 is connected to the signal output end Vout via a first electrode of the fourth switching transistor M4, and the first electrode of the fourth switching transistor M4 serves as the first electrode of the voltage following transistor M0. During the implementation, at the first stage, the first switching transistor M1 may be turned on under the control of the first resetting control end Reset1, the second switching transistor M4 may be turned off under the control of the scanning signal end Scan, and the fourth switching transistor M4 may be turned on under the control of the third resetting control end Reset3. The predetermined voltage $V_{data}$ may be applied to the first electrode of the voltage following transistor M0, so as to turn on the voltage following transistor M0 and implement the above-mentioned charging procedure. Then, the fourth switching transistor M4 may be turned off under the control of the third resetting control end Reset3. At the third stage, after the second switching transistor is turned on under the control of the scanning signal end Scan for a predetermined time period, the fourth switching transistor M4 may be turned on under the control of the third resetting control end Reset3, so as to turn on the voltage following transistor M0 for the second time and turn on the current source CO. At this time, the second electrode of the voltage following transistor M0 may output the voltage signal independent of the threshold voltage of the voltage following transistor M0 to the signal output end Vout. In other words, in the case that the second switching transistor M2 is turned on, the fourth switching transistor M4 may not be turned on, so as to prevent the first electrode of the voltage following transistor M0 from outputting any signal, thereby to prevent the clock signal from being coupled to the first electrode of the voltage following transistor M0 via the first electrode of the second switching transistor M2. After the second switching transistor M2 is in an on state for the predetermined time period, the fourth switching transistor M4 may be turned on, so as to enable the first electrode of the voltage following transistor M0 to output the signal. In this way, it is able to effectively reduce the adverse influence on the output signal by the clock feed-through effect occurring for the second switching transistor M2, further increase the signal-to-noise ratio of the output signal, and enable the fingerprint detection circuit to detect the fingerprint in a better manner. The predetermined time period may be set in accordance with a degree of the influence of the clock feed-through effect of the second switching transistor M2 on the output signal. FIG. 5 shows a sequence diagram of the fingerprint detection circuit.

Figure 6:
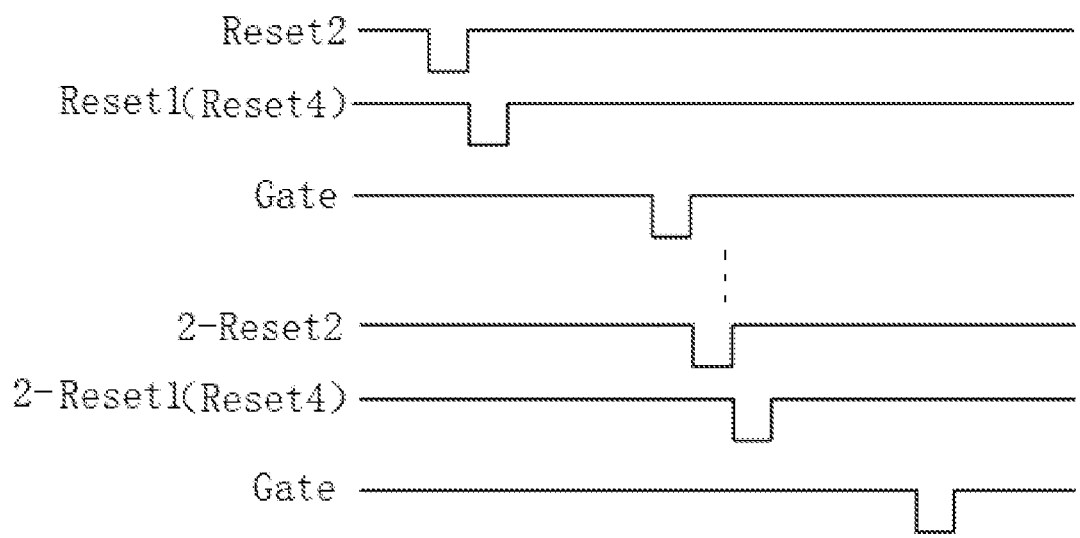
FIG. 6 is yet another sequence diagram of the fingerprint detection circuit according to one embodiment of the present disclosure.

As shown in FIG. 3, the fingerprint detection circuit may further include a fifth switching transistor M5, a gate electrode of which is connected to a fourth resetting control end Reset4, a first electrode of which is connected to the first electrode of the voltage following transistor M0, and a second electrode of which is connected to a fifth reference voltage end Vref5. A voltage from the fifth reference voltage end Vref5 may be equal to the predetermined voltage $V_{data}$ applied to the first electrode of the voltage following transistor M0. At the first stage, the fifth switching transistor M5 may be turned on under the control of the fourth resetting control end Reset4, so as to apply the reference voltage from the fifth reference voltage end Vref5 to the first electrode of the voltage following transistor M0, thereby to turn on the voltage following transistor M0 for the first time. Of course, the voltage from the fifth reference voltage end Vref5 may change depending on whether or not the voltage following transistor M0 is a P-channel transistor or an N-channel transistor, so as to enable the voltage $V_G$ applied to the node G to be equal to the sum of, or the difference between, the predetermined voltage $V_{data}$ and the threshold voltage $V_{th}$ of the voltage following transistor M0. In other words, the predetermined voltage $V_{data}$ applied to the first electrode of the voltage following transistor M0 may be provided by a fixed reference voltage end, rather than the IC connected to the signal output end Vout of the fingerprint detection circuit. In this way, it is able to reduce a load of the IC and reduce the manufacture cost. FIG. 6 shows a sequence diagram of the fingerprint detection circuit.

It should be appreciated that, the fingerprint detection circuit may include the third switching transistor M3, the fourth switching transistor M4 and the fifth switching transistor M5 simultaneously, so as to improve the working efficiency of the fingerprint detection circuit and further increase the signal-to-noise ratio of the output signal, thereby to enable the fingerprint detection circuit to detect the fingerprint in a better manner. In addition, it is able to reduce the load of the IC and reduce the manufacture cost thereof.

Figure 7:
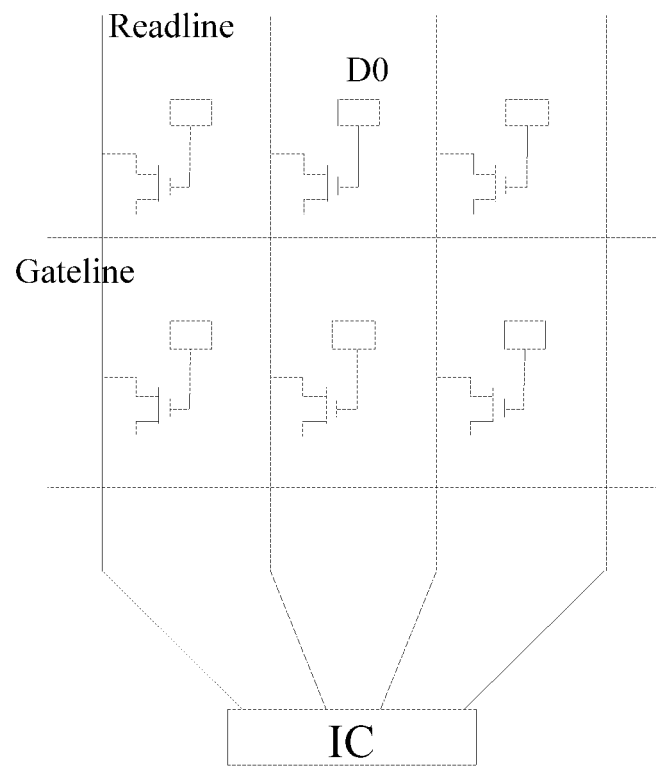
FIG. 7 is a schematic view showing a fingerprint sensor according to one embodiment of the present disclosure.

As shown in FIG. 7, the present disclosure further provides a fingerprint sensor, including the above-mentioned fingerprint detection circuit. To be specific, the fingerprint sensor may be an independent push-button fingerprint sensor which may include a plurality of identification units arranged in an array form. Each of the identification units includes the fingerprint detection circuit, a scanning line Gateline connected to the scanning signal end Scan of each of the fingerprint detection circuits in rows, and a reading line Readline connected to the signal output end Vout of each of the fingerprint detection circuits in columns. The fingerprint sensor may scan the scanning lines Gateline progressively in a row by row manner. In the case that the scanning line Gateline in a current row is scanned, the second switching transistor M2 (not shown in FIG. 7) in this row may be turned on, and then a voltage signal from the node G, i.e., a photosensitive signal voltage, may be outputted to the corresponding reading line Readline via the voltage following transistor M0 (transistor in FIG. 7), and the fingerprint signal may be collected by the IC through the corresponding reading line Readline. After all the scanning lines have been scanned, it is able to acquire fingerprint data of a frame. The fingerprint data may then be processed at a back end of a processor, so as to acquire a pattern of the fingerprint.

According to the fingerprint sensor in the embodiments of the present disclosure, in the fingerprint detection circuit of the fingerprint sensor, the gate electrode of the first switching transistor is connected to the first resetting control end, the first electrode thereof is connected to the node, and the second electrode thereof is connected to the second electrode of the voltage following transistor. The gate electrode of the second switching transistor is connected to the scanning signal end of the fingerprint detection circuit, the first electrode thereof is connected to the second electrode of the voltage following transistor, and the second electrode thereof is connected to the first reference voltage end. The gate electrode of the voltage following transistor is connected to the node, and the first electrode thereof is connected to the signal output end of the fingerprint detection circuit, and connected to the second reference voltage end via the current source. The first electrode of the photosensitive unit is connected to the third reference voltage end, and the second electrode thereof is connected to the node. In the case that the first switching transistor is turned on, the second switching transistor is turned off and the predetermined voltage is applied to the first electrode of the voltage following transistor, it is able to turn on the voltage following transistor, and enable the first electrode of the voltage following transistor to charge the node through the first switching transistor or enable the node to charge the first electrode of the voltage following transistor through the first switching transistor until the voltage following transistor is turned off and the voltage applied to the node is reset to a value related to the threshold voltage of the voltage following transistor. As a result, it is able to output, through the first electrode of the voltage following transistor, a voltage signal independent of the threshold voltage of the voltage following transistor, provide an ideal following effect for the voltage following transistor, prevent the occurrence of the drift for the output data from the fingerprint detection circuit and increase the signal-to-noise ratio of the output signal, thereby to enable the fingerprint detection circuit to detect the fingerprint normally.

Figure 8:
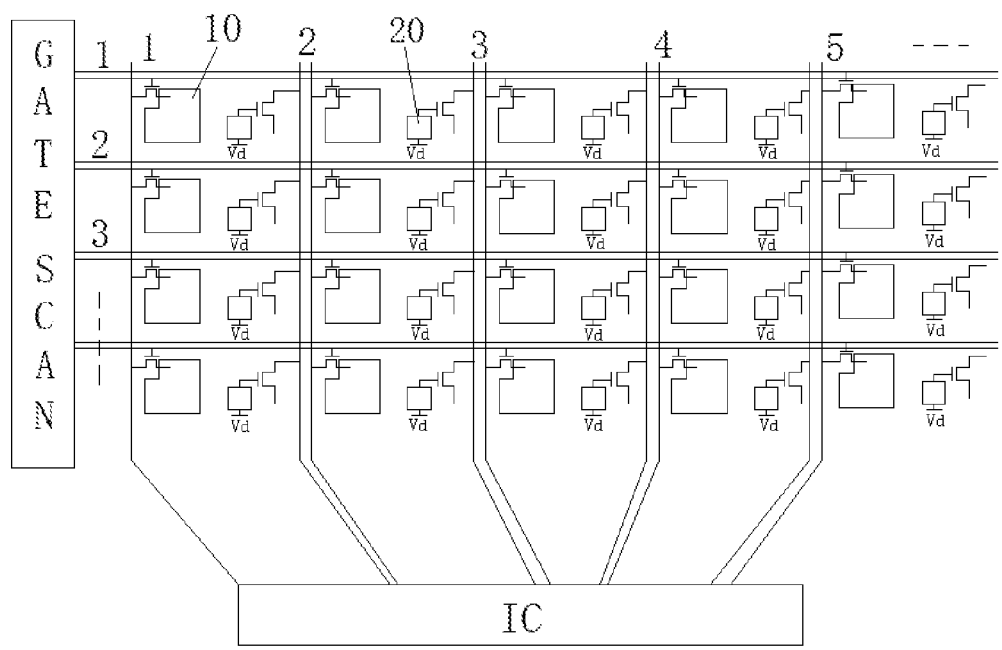
FIG. 8 is another schematic view showing the fingerprint sensor according to one embodiment of the present disclosure.

As shown in FIG. 8, the present disclosure further provides in some embodiments a fingerprint sensor which includes a plurality of pixel units 10 arranged in an array form. Each pixel unit 10 includes the above-mentioned fingerprint detection circuit. In FIG. 8, the reference sign 20 represents the photosensitive unit. To be specific, the fingerprint sensor may be a fingerprint sensor integrated into a screen, i.e., a sensor with both a display function and a fingerprint identification function. The photosensitive units and the fingerprint detection circuits may be formed on a thin film transistor back plate. Through this fingerprint sensor, it is able to achieve the fingerprint identification function in a full-screen manner, thereby to improve the user experience. In addition, through the integration of a function of a touch panel into a pixel, it is able to achieve the fingerprint identification function without any on-cell fingerprint sensor, thereby to reduce the manufacture cost. The fingerprint sensor may be formed at a display region and at a position where a black matrix is located, so as to prevent a display function and an aperture ratio from being adversely affected, and the fingerprint detection circuit of the sensor may be separated from the display circuit, so as to achieve the fingerprint detection function independent of the display function.

According to the fingerprint sensor in the embodiments of the present disclosure, in the fingerprint detection circuit of the fingerprint sensor, the gate electrode of the first switching transistor is connected to the first resetting control end, the first electrode thereof is connected to the node, and the second electrode thereof is connected to the second electrode of the voltage following transistor. The gate electrode of the second switching transistor is connected to the scanning signal end of the fingerprint detection circuit, the first electrode thereof is connected to the second electrode of the voltage following transistor, and the second electrode thereof is connected to the first reference voltage end. The gate electrode of the voltage following transistor is connected to the node, and the first electrode thereof is connected to the signal output end Vout of the fingerprint detection circuit, and connected to the second reference voltage end via the current source. The first electrode of the photosensitive unit is connected to the third reference voltage end, and the second electrode thereof is connected to the node. In the case that the first switching transistor is turned on, the second switching transistor is turned off and the predetermined voltage is applied to the first electrode of the voltage following transistor, it is able to turn on the voltage following transistor, and enable the first electrode of the voltage following transistor to charge the node through the first switching transistor or enable the node to charge the first electrode of the voltage following transistor through the first switching transistor until the voltage following transistor is turned off and the voltage applied to the node is reset to a value related to the threshold voltage of the voltage following transistor. As a result, it is able to output, through the first electrode of the voltage following transistor, a voltage signal independent of the threshold voltage of the voltage following transistor, provide an ideal following effect for the voltage following transistor, prevent the occurrence of the drift for the output data from the fingerprint detection circuit and increase the signal-to-noise ratio of the output signal, thereby to enable the fingerprint detection circuit to detect the fingerprint normally.

Figure 9:
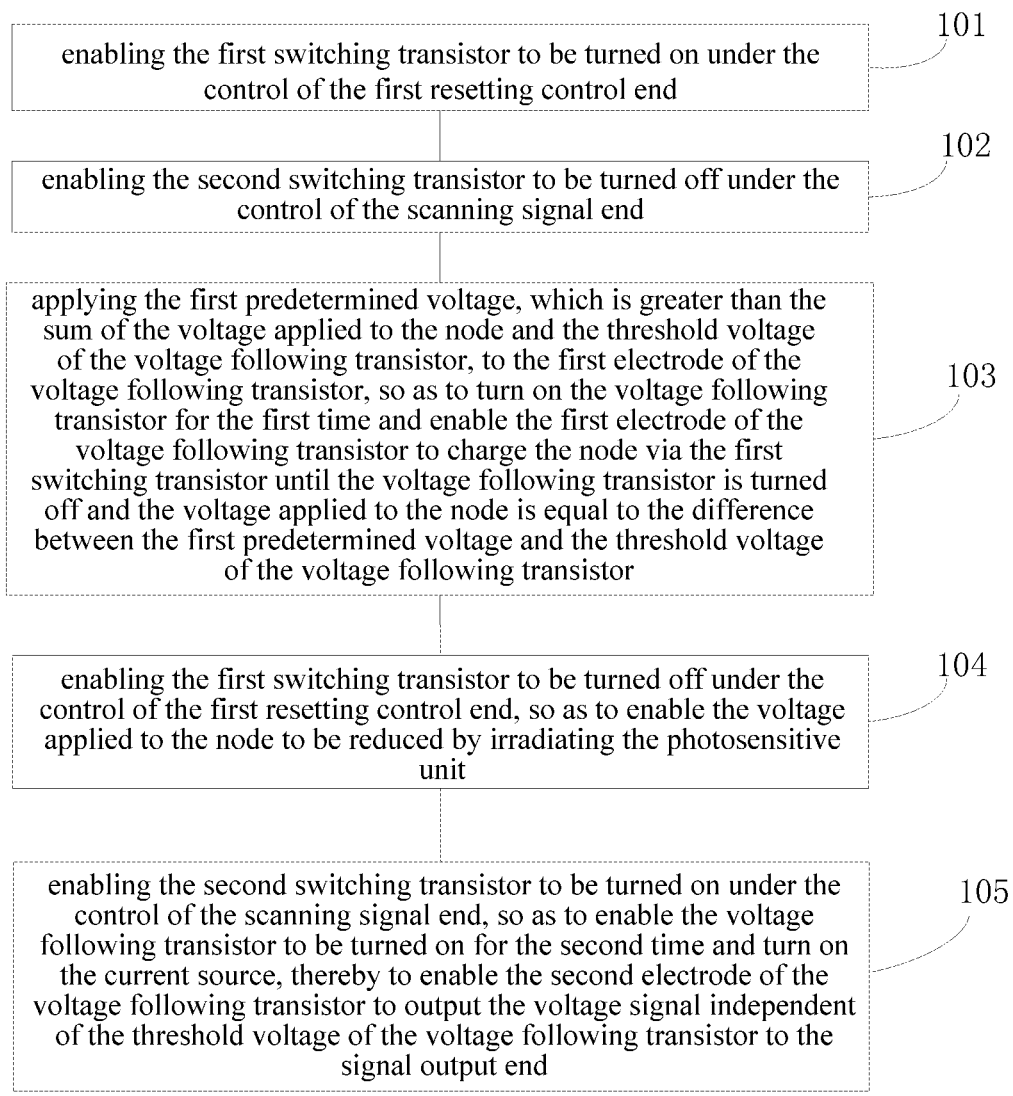
FIG. 9 is a flow chart of a detection method for a fingerprint detection circuit according to one embodiment of the present disclosure.

As shown in FIG. 9 in conjunction with FIG. 1, the present disclosure further provides in some embodiments a detection method for use in the above-mentioned fingerprint detection circuit. The voltage following transistor M0 in the fingerprint detection circuit is a P-channel transistor. The photosensitive unit DO may be a photodiode, an anode of which is connected to the third reference voltage end Vref3 and a cathode of which is connected to the node G. The detection method includes the following steps.

Step 101: enabling the first switching transistor M1 to be turned on under the control of the first resetting control end Reset1.

Step 102: enabling the second switching transistor M2 to be turned off under the control of the scanning signal end Scan.

The first resetting control end Reset1 may be a clock signal output end Vout of an IC connected to the signal output end Vout of the fingerprint detection circuit, and the clock signal output end Vout of the IC is capable of generating a square wave at a certain duty ratio, so as to turn on or off the first switching transistor M1. The scanning signal end Scan may be a signal end connected to a gate scanning signal output end Vout of the IC. In the case that the fingerprint detection circuit in a certain row is scanned by a gate scanning signal from the IC, the second switching transistor M2 of the fingerprint detection circuit may be turned on, so as to enable the first electrode of the voltage following transistor M0 to output the signal. Through the first switching transistor M1 in an on state and the second switching transistor M2, it is able to prepare for the subsequent elimination of the threshold voltage drift of the voltage following transistor M0.

Step 103: applying a first predetermined voltage, which is greater than a sum of a voltage applied to the node G and a threshold voltage of the voltage following transistor M0, to the first electrode of the voltage following transistor M0, so as to turn on the voltage following transistor M0 for the first time and enable the first electrode of the voltage following transistor M0 to charge the node G via the first switching transistor M1 until the voltage following transistor M0 is turned off and the voltage applied to the node G is equal to a difference between the first predetermined voltage and the threshold voltage of the voltage following transistor M0.

The first predetermined voltage $V_{data}$ may be applied to the first electrode of the first switching transistor M1, i.e., the gate electrode of the voltage following transistor M0, and the first predetermined voltage $V_{data}$ may be greater than the sum of the voltage $V_G$ applied to the node G and the threshold voltage $V_{th}$ of the voltage following transistor M0, so as to turn on the voltage following transistor M0 due to its turn-on condition being satisfied. At this time, the first switching transistor M1 is in the on state, the first electrode of the voltage following transistor M0 may be electrically connected to the node G, so as to charge the node G, i.e., charge the gate electrode of the voltage following transistor M0, thereby to pull up the potential at the node G. In the case that the potential at the node G is increased to be insufficient to turn on the voltage following transistor M0, the voltage following transistor M0 may be turned off. At this time, the voltage $V_G$ applied to the node G may be equal to the difference between the first predetermined voltage $V_{data}$ and the threshold voltage $V_{th}$ of the voltage following transistor M0, i.e., $V_G=V_{data}-V_{th}$. The first predetermined voltage $V_{data}$ may be provided by the IC connected to the signal output end Vout of the fingerprint detection circuit.

Step 104: enabling the first switching transistor M1 to be turned off under the control of the first resetting control end Reset1, so as to enable the voltage applied to the node G to be reduced in the case that the photosensitive unit DO is irradiated.

In the case that the first switching transistor M1 is turned off, the photodiode may be irradiated with light beams reflected by valleys and ridges of a fingerprint. At this time, the potential at the node G may be reduced by $\Delta S$, i.e., $V_G=V_{data}-V_{th}-\Delta S$.

Step 105: enabling the second switching transistor M2 to be turned on under the control of the scanning signal end Scan, so as to enable the voltage following transistor M0 to be turned on for the second time and turn on the current source C0, thereby to enable the second electrode of the voltage following transistor M0 to output a voltage signal independent of the threshold voltage of the voltage following transistor M0 to the signal output end Vout.

In step 104, the potential $V_G$ at the node G is reduced, so the voltage following transistor M0 may be turned on again in the case that t is turn-on condition has been met. In addition, the second switching transistor M2 may be turned on under the control of a gate scanning signal from the IC. Hence, the current source C0, the voltage following transistor M0 and the second switching transistor M2 may form a conductive path. At this time, a voltage signal $V_S$ may be outputted from the first electrode of the voltage following transistor M0. On the basis of the formulae $V_S-V_G \approx V_{th}+K$, and $V_S-(V_{data}-V_{th}-\Delta S) \approx V_{th}+K$, it may be deduced that $V_S \approx V_{data}-\Delta S+K$, where K, is a constant. Hence, the voltage signal $V_S$ from the first electrode of the voltage following transistor M0 is merely related to the potential change $\Delta S$ at the node G, but independent of the threshold voltage $V_{th}$ of the voltage following transistor M0. As a result, it is able to eliminate the influence caused by a threshold voltage drift of the voltage following transistor M0, prevent the occurrence of a drift for output data from the fingerprint detection circuit, and increase a signal-to-noise ratio of the output signal, thereby to enable the fingerprint detection circuit to detect the fingerprint normally.

According to the detection method for the fingerprint detection circuit in the embodiments of the present disclosure, in the fingerprint detection circuit, the gate electrode of the first switching transistor is connected to the first resetting control end, the first electrode thereof is connected to the node, and the second electrode thereof is connected to the second electrode of the voltage following transistor. The gate electrode of the second switching transistor is connected to the scanning signal end of the fingerprint detection circuit, the first electrode thereof is connected to the second electrode of the voltage following transistor, and the second electrode thereof is connected to the first reference voltage end. The gate electrode of the voltage following transistor is connected to the node, and the first electrode thereof is connected to the signal output end and connected to the second reference voltage end via the current source. The first electrode of the photosensitive unit is connected to the third reference voltage end, and the second electrode thereof is connected to the node. In the case that the voltage following transistor is the P-channel transistor, the first switching transistor is turned on, the second switching transistor is turned off and the predetermined voltage is applied to the first electrode of the voltage following transistor, it is able to turn on the voltage following transistor, and enable the first electrode of the voltage following transistor to charge the node through the first switching transistor until the voltage following transistor is turned off and the voltage applied to the node is reset to a value related to the threshold voltage of the voltage following transistor. As a result, it is able to output, through the first electrode of the voltage following transistor, a voltage signal independent of the threshold voltage of the voltage following transistor, provide an ideal following effect for the voltage following transistor, prevent the occurrence of the drift for the output data from the fingerprint detection circuit and increase the signal-to-noise ratio of the output signal, thereby to enable the fingerprint detection circuit to detect the fingerprint normally.

Figure 10:
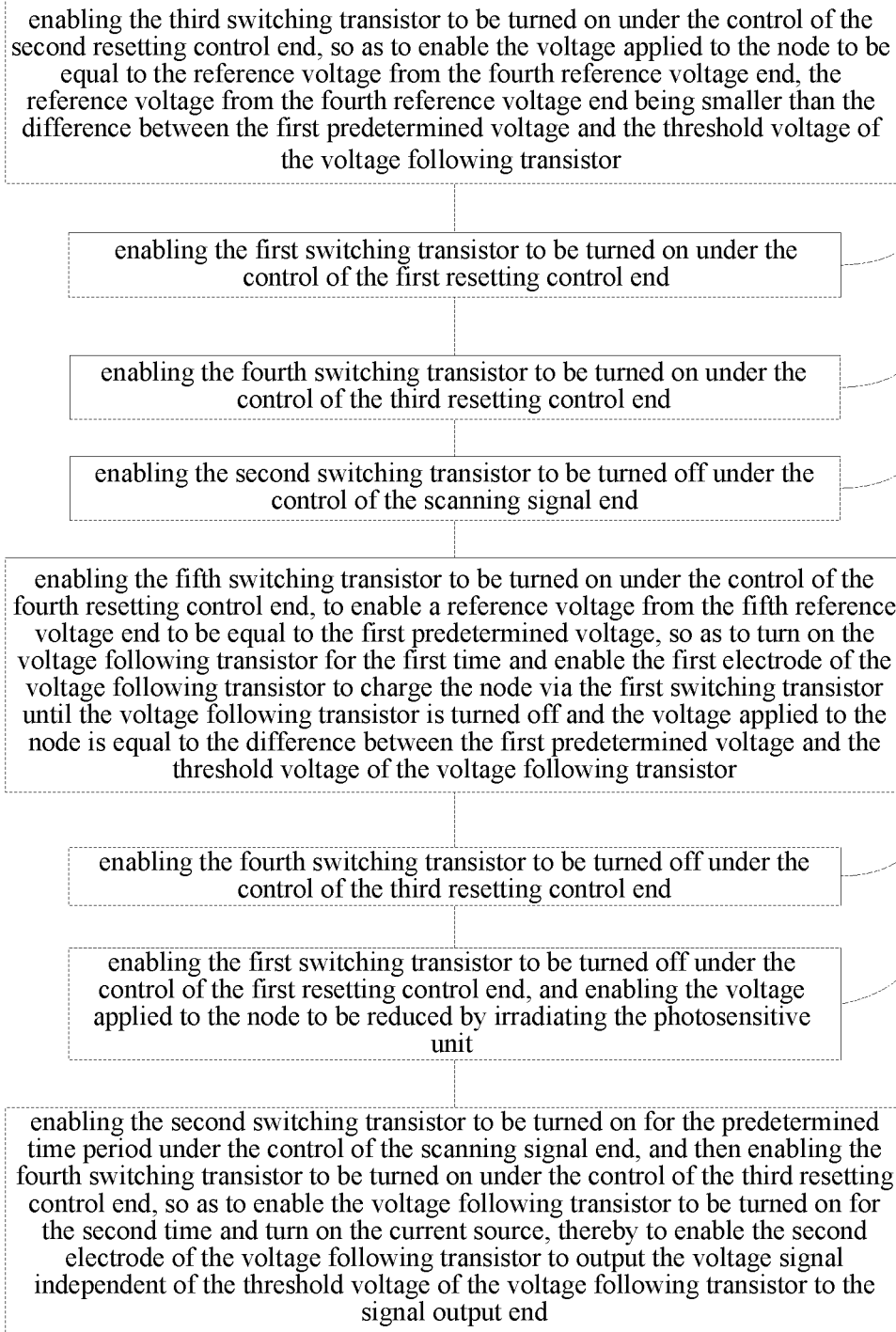
FIG. 10 is another flow chart of another detection method for a fingerprint detection circuit according to one embodiment of the present disclosure.

As shown in FIG. 10 in conjunction with FIGS. 1, 2 and 3, the present disclosure further provides in some embodiments another detection method for use in the above-mentioned fingerprint detection circuit. The voltage following transistor M0 of the fingerprint detection circuit is a P-channel transistor. The fingerprint detection circuit further includes the third switching transistor M3, the fourth switching transistor M4 and the fifth switching transistor M5. The gate electrode of the third switching transistor M3 is connected to the second resetting control end, the first electrode thereof is connected to the fourth reference voltage end Vref4, and the second electrode thereof is connected to the node G. The gate electrode of the fourth switching transistor M4 is connected to the third resetting control end Reset3, the second electrode thereof is connected to the first electrode of the voltage following transistor M0. The first electrode of the voltage following transistor M0 is connected to the signal output end Vout via the first electrode of the fourth switching transistor M4, and the first electrode of the fourth switching transistor M4 serves as the first electrode of the voltage following transistor M0. The gate electrode of the fifth switching transistor M5 is connected to the fourth resetting control end Reset4, the first electrode thereof is connected to the first electrode of the voltage following transistor M0, and the second electrode thereof is connected to the fifth reference voltage end Vref5. The detection method includes the following steps.

Step 201: enabling the third switching transistor M3 to be turned on under the control of the second resetting control end, so as to enable the voltage applied to the node G to be equal to a reference voltage from the fourth reference voltage end Vref4. The reference voltage from the fourth reference voltage end Vref4 is smaller than a difference between the first predetermined voltage and the threshold voltage of the voltage following transistor M0.

The second resetting control end may be a clock signal output end Vout of the IC connected to the signal output end Vout of the fingerprint detection circuit, and it is capable of generating a square wave at a certain duty ratio, so as to turn on or off the second switching transistor M2. As mentioned above, the first predetermined voltage $V_{data}$ applied to the first electrode of the voltage following transistor M0 shall be greater than the sum of the voltage applied to the node G and the threshold voltage $V_{th}$ of the voltage following transistor M0, so as to turn on the voltage following transistor M0. In order to rapidly change the potential at the node G to accurately satisfy the requirement and improve the working efficiency of the fingerprint detection circuit, the fingerprint detection circuit may further include the third switching transistor M3, the gate electrode of which is connected to the second resetting control end, the first electrode of which is connected to the fourth reference voltage end Vref4, and the second electrode of which is connected to the node G. After the third switching transistor is turned on under the control of the second resetting control end, the potential at the node G may be rapidly changed to be equal to the first reference voltage from the fourth reference voltage end Vref4. The first reference voltage from the fourth reference voltage end Vref4 shall meet such a condition that the predetermined voltage $V_{data}$ is greater than a sum of the first reference voltage from the fourth reference voltage end Vref4 and the threshold voltage $V_{th}$ of the voltage following transistor M0. In this way, it is able to rapidly cause the predetermined voltage $V_{data}$ to be greater than the sum of the voltage applied to the node G and the threshold voltage $V_{th}$ of the voltage following transistor M0, thereby to rapidly turn on the voltage following transistor M0 due to its turn-on condition being satisfied and improve the working efficiency of the fingerprint detection circuit.

Step 202: enabling the first switching transistor M1 to be turned on under the control of the first resetting control end Reset1.

The first resetting control end Reset1 may be a clock signal output end Vout of the IC connected to the signal output end Vout of the fingerprint detection circuit, and it is capable of generating a square wave at a certain duty ratio, so as to turn on or off the first switching transistor M1. Through the first switching transistor M1 in an on state, it is able to prepare for the subsequent elimination of the threshold voltage drift of the voltage following transistor M0.

Step 203: enabling the fourth switching transistor M4 to be turned on under the control of the third resetting control end Reset3.

The third resetting control end Reset3 may be a clock signal output end Vout of the IC connected to the signal output end Vout of the fingerprint detection circuit, and the clock signal output end Vout of the IC is capable of generating a square wave at a certain duty ratio, so as to turn on or off the fourth switching transistor M4. Through the fourth switching transistor M4, it is able to prevent the output signal from the first electrode of the voltage following transistor M0 from being adversely affected by the clock feed-through effect of the second switching transistor M2 (a principle thereof may refer to Step 208, and thus will not be particularly defined herein). In Step 203, the fourth switching transistor M4 is turned on under the control of the third resetting control end Reset3, so as to prepare for the input of the first predetermined voltage $V_{data}$ to the first electrode of the voltage following transistor M0, thereby to enable the first electrode of the voltage following transistor M0 to charge the node G.

Step 204: enabling the second switching transistor M2 to be turned off under the control of the scanning signal end Scan.

The scanning signal end Scan may be a signal end connected to a gate scanning signal output end Vout of the IC. In the case that the fingerprint detection circuit in a certain row is scanned by a gate scanning signal from the IC, the second switching transistor M2 of the fingerprint detection circuit may be turned on, so as to enable the first electrode of the voltage following transistor M0 to output the signal. Through the second switching transistor M2, it is able to prepare for the subsequent elimination of the threshold voltage drift of the voltage following transistor M0. Step 203 may also be performed subsequent to Step 204, as long as the node G may be charged using the first predetermined voltage $V_{data}$.

Step 205: enabling the fifth switching transistor M5 to be turned on under the control of the fourth resetting control end Reset4, to enable a reference voltage from the fifth reference voltage end Vref5 to be equal to the first predetermined voltage, so as to turn on the voltage following transistor M0 for the first time and enable the first electrode of the voltage following transistor M0 to charge the node G via the first switching transistor M1 until the voltage following transistor M0 is turned off and the voltage applied to the node G is equal to the difference between the first predetermined voltage and the threshold voltage of the voltage following transistor M0.

To be specific, the reference voltage from the fifth reference voltage end Vref5 may be equal to the first predetermined voltage $V_{data}$ applied to the first electrode of the voltage following transistor M0. In addition, Step 205 may be performed simultaneously with Steps 202 and 203, i.e., the first switching transistor M1, the fourth switching transistor M4 and the fifth switching transistor M5 may be turned on simultaneously. In Step 205, the fifth switching transistor M5 may be turned on under the control of the fourth resetting control end Reset4, so as to apply the reference voltage from the fifth reference voltage end Vref5 to the first electrode of the voltage following transistor M0, thereby to turn on the voltage following transistor M0 due to its turn-on condition being satisfied. At this time, the first electrode of the voltage following transistor M0 may be electrically connected to the node G and charge the node G, i.e., charge the gate electrode of the voltage following transistor M0, so as to pull up the potential at the node G. In the case that the potential at the node G is increased to do not meet the turn-on condition of the voltage following transistor M0, the voltage following transistor M0 may be turned off. At this time, the voltage $V_G$ applied to the node G may be equal to the difference between the first predetermined voltage $V_{data}$ and the threshold voltage $V_{th}$ of the voltage following transistor M0, i.e., $V_G = V_{data} - V_{th}$. In other words, the first predetermined voltage $V_{data}$ may be applied to the first electrode of the voltage following transistor M0 through a fixed reference voltage end, rather than the IC connected to the signal output end Vout of the fingerprint detection circuit. In this way, it is able to reduce the load of the IC, thereby to reduce the manufacture cost thereof.

Step 206: enabling the fourth switching transistor M4 to be turned off under the control of the third resetting control end Reset3.

As mentioned above, the third resetting control end Reset3 may be a clock signal output end Vout of the IC connected to the signal output end Vout of the fingerprint detection circuit, and the clock signal output end Vout of the IC is capable of generating a square wave at a certain duty ratio so as to turn on or off the fourth switching transistor M4. In Step 206, the fourth switching transistor M4 is turned off, so as to reduce the adverse influence on the output signal by the clock feed-through effect of the second switching transistor M2 subsequently during the signal output. A principle thereof may refer to Step 208, and thus will not be particularly defined herein.

Step 207: enabling the first switching transistor M1 to be turned off under the control of the first resetting control end Reset1, and enabling the voltage applied to the node G to be reduced by irradiating the photosensitive unit DO.

The photosensitive unit DO may be a photodiode. In the case that the first switching transistor M1 is turned off, the photodiode may be irradiated with the light beams reflected by the valleys and ridges of the fingerprint, so the potential at the node G may be reduced is reduced and equal to $V_G \approx V_{data} - V_{th} - \Delta S$.

Step 208: enabling the second switching transistor to be turned on for a predetermined time period under the control of the scanning signal end Scan, and then enabling the fourth switching transistor M4 to be turned on under the control of the third resetting control end Reset3, so as to enable the voltage following transistor M0 to be turned on for the second time and turn on the current source CO, thereby to enable the second electrode of the voltage following transistor M0 to output the voltage signal independent of the threshold voltage of the voltage following transistor M0 to the signal output end Vout.

In Step 207, the potential $V_G$ at the node G may be reduced, so as to turn on the voltage following transistor M0 again due to its turn-on condition being satisfied. In addition, the second switching transistor M2 may be turned on under the control of the gate scanning signal from the IC, and the fourth switching transistor M4 may be turned on under the control of the fourth resetting control end Reset4, so the current source CO, the voltage following transistor M0 and the second switching transistor M2 may form a conductive path. At this time, the voltage signal $V_S$ may be outputted from the first electrode of the voltage following transistor M0. On the basis of the formulae $V_S - V_G \approx V_{th} + K$, and $V_S - (V_{data} - V_{th} - \Delta S) \approx V_{th} + K$, it may be deduced that $V_S \approx V_{data} - \Delta S + K$, where K, is a constant. Hence, the voltage signal $V_S$ from the first electrode of the voltage following transistor M0 is merely related to the potential change $\Delta S$ at the node G, but independent of the threshold voltage $V_{th}$ of the voltage following transistor M0. As a result, it is able to eliminate the influence caused by a threshold voltage drift of the voltage following transistor M0, prevent the occurrence of a drift for output data from the fingerprint detection circuit, and increase a signal-to-noise ratio of the output signal, thereby to enable the fingerprint detection circuit to detect the fingerprint normally.

In Step 207, the second switching transistor M2 may be turned on upon the receipt of a clock signal from the scanning signal end Scan connected to its gate electrode. At this time, a clock feed-through effect may easily occur for the second switching transistor M2, so the clock signal may probably be coupled to its first electrode and thereby to the first electrode of the voltage following transistor M0 via its first electrode. Hence, the output signal from the first electrode of the voltage following transistor M0 may be adversely affected. In order to reduce the adverse influence on the output signal by the clock feed-through effect occurring for the second switching transistor M2, further increase the signal-to-noise ratio of the output signal and enable the fingerprint detection circuit to detect the fingerprint in a better manner, the second switching transistor may be turned on under the control of the scanning signal end Scan for a predetermined time period, and the fourth switching transistor M4 may be turned on under the control of the third resetting control end Reset3, so as to turn on the voltage following transistor M0 for the second time and turn on the current source CO. At this time, the second electrode of the voltage following transistor M0 may output the voltage signal independent of the threshold voltage of the voltage following transistor M0 to the signal output end Vout. In other words, in the case that the second switching transistor M2 is turned on, the fourth switching transistor M4 may not be turned on, so as to prevent the first electrode of the voltage following transistor M0 from outputting any signal, thereby to prevent the clock signal from being coupled to the first electrode of the voltage following transistor M0 via the first electrode of the second switching transistor M2. After the second switching transistor M2 is in an on state for the predetermined time period, the fourth switching transistor M4 may be turned on, so as to enable the first electrode of the voltage following transistor M0 to output the signal. In this way, it is able to effectively reduce the adverse influence on the output signal by the clock feed-through effect occurring for the second switching transistor M2, further increase the signal-to-noise ratio of the output signal, and enable the fingerprint detection circuit to detect the fingerprint in a better manner. The predetermined time period may be set in accordance with a degree of the influence of the clock feed-through effect of the second switching transistor M2 on the output signal.

According to the detection method in the embodiments of the present disclosure, in the fingerprint detection circuit, the gate electrode of the first switching transistor is connected to the first resetting control end Reset1, the first electrode thereof is connected to the node, and the second electrode thereof is connected to the second electrode of the voltage following transistor. The gate electrode of the second switching transistor is connected to the scanning signal end of the detection circuit, the first electrode thereof is connected to the second electrode of the voltage following transistor, and the second electrode thereof is connected to the first reference voltage end. The gate electrode of the voltage following transistor is connected to the node, and the first electrode thereof is connected to the signal output end of the detection circuit and connected to the second reference voltage end via the current source. The first electrode of the photosensitive unit is connected to the third reference voltage end, and the second electrode thereof is connected to the node. In the case that the voltage following transistor is the P-channel transistor, the first switching transistor is turned on, the second switching transistor is turned off and the predetermined voltage is applied to the first electrode of the voltage following transistor, it is able to turn on the voltage following transistor, and enable the first electrode of the voltage following transistor to charge the node through the first switching transistor, such that the voltage applied to the node is reset to be a value independent of the threshold voltage of the voltage following, and an ideal following effect is provided. As a result, it is able to prevent the occurrence of the drift for the output data from the fingerprint detection circuit and increase the signal-to-noise ratio of the output signal, thereby to enable the fingerprint detection circuit to detect the fingerprint normally.

Figure 11:
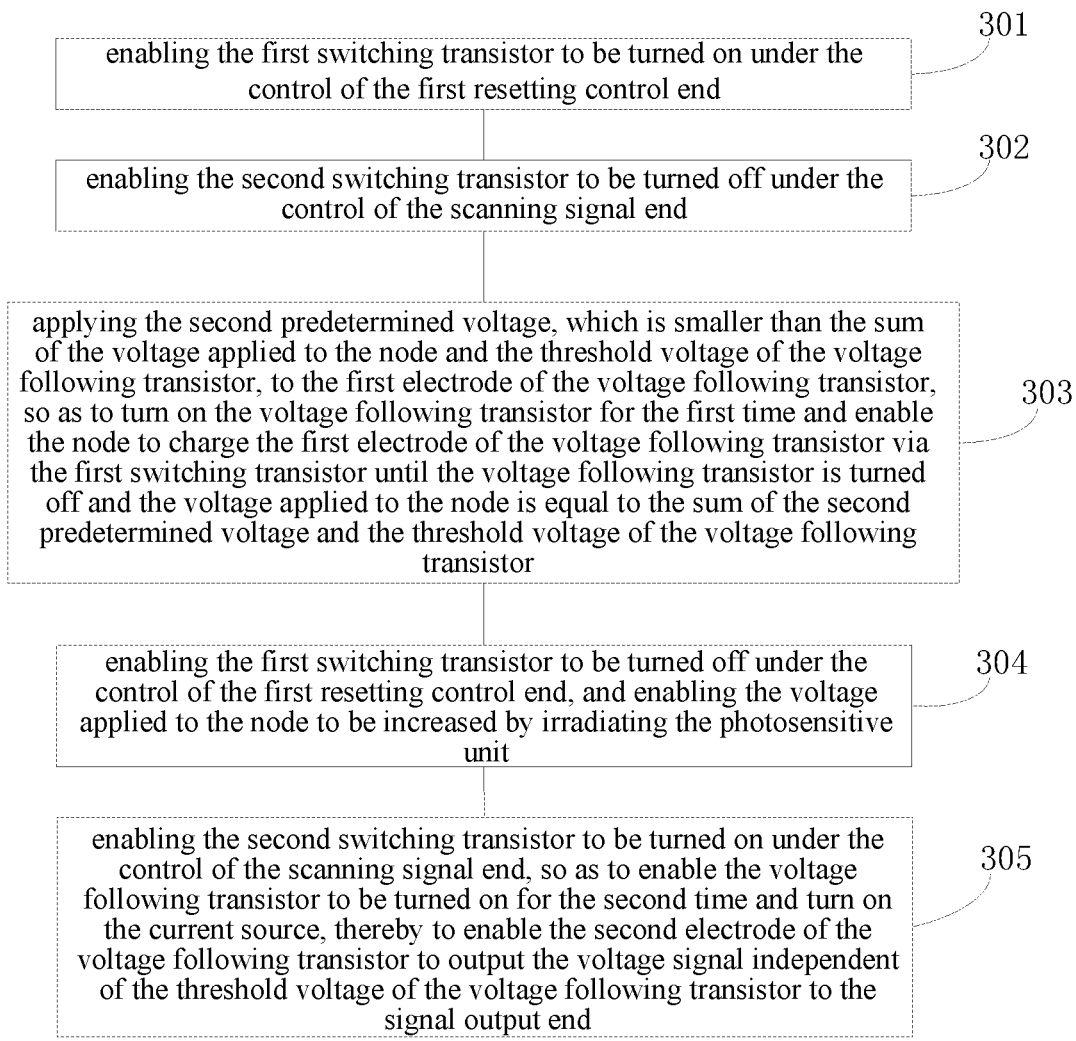
FIG. 11 is yet another flow chart of yet another detection method for a fingerprint detection circuit according to one embodiment of the present disclosure.

As shown in FIG. 11 in conjunction with FIG. 1, the present disclosure further provides in some embodiments a detection method for use in the above-mentioned fingerprint detection circuit. The voltage following transistor M0 of the fingerprint detection circuit is an N-channel transistor. The photosensitive unit DO may be a photodiode, a cathode of which is connected to the third reference voltage end Vref3, and an anode of which is connected to the node G. The detection method includes the following steps.

Step 301: enabling the first switching transistor M1 to be turned on under the control of the first resetting control end Reset1.

Step 302: enabling the second switching transistor M2 to be turned off under the control of the scanning signal end Scan.

The first resetting control end Reset1 may be a clock signal output end Vout of an IC connected to the signal output end Vout of the fingerprint detection circuit, and it is capable of generating a square wave at a certain duty ratio, so as to turn on or off the first switching transistor M1. The scanning signal end Scan may be a signal end connected to a gate scanning signal output end Vout of the IC. In the case that the fingerprint detection circuit in a certain row is scanned by a gate scanning signal from the IC, the second switching transistor M2 of the fingerprint detection circuit may be turned on, so as to enable the first electrode of the voltage following transistor M0 to output the signal. Through the first switching transistor M1 in an on state and the second switching transistor M2 in an off state, it is able to prepare for the subsequent elimination of the threshold voltage drift of the voltage following transistor M0.

Step 303: applying a second predetermined voltage, which is smaller than a sum of a voltage applied to the node G and a threshold voltage of the voltage following transistor M0, to the first electrode of the voltage following transistor M0, so as to turn on the voltage following transistor M0 for the first time and enable the node G to charge the first electrode of the voltage following transistor M0 via the first switching transistor M1 until the voltage following transistor M0 is turned off and the voltage applied to the node G is equal to a sum of the second predetermined voltage and the threshold voltage of the voltage following transistor M0.

The second predetermined voltage $V_{data}$ may be applied to the first electrode of the voltage following transistor M0, i.e., the gate electrode of the voltage following transistor M0, and the second predetermined voltage $V_{data}$ is smaller than the sum of the voltage $V_G$ applied to the node G and the threshold voltage $V_{th}$ of the voltage following transistor M0, so as to turn on the voltage following transistor M0 due to its turn-on condition being satisfied. At this time, the first switching transistor M1 is turned on, so the first electrode of the voltage following transistor M0 may be electrically connected to the node G, so as to enable the node G to charge the first electrode of the voltage following transistor M0, i.e., charge the gate electrode of the voltage following transistor M0, thereby to pull up the potential at the node G. In the case that the potential at the node G is sufficiently large and does not meet the turn-on condition of the voltage following transistor M0, the voltage following transistor M0 may be turned off. At this time, the voltage $V_G$ at the node G may be equal to the sum of the second predetermined voltage $V_{data}$ and the threshold voltage $V_{th}$ of the voltage following transistor M0, i.e., $V_G = V_{data} + V_{th}$. The second predetermined voltage $V_{data}$ may be provided by the IC connected to the signal output end Vout of the fingerprint detection circuit.

Step 304: enabling the first switching transistor M1 to be turned off under the control of the first resetting control end Reset1, and enabling the voltage applied to the node G to be increased in the case that the photosensitive unit DO is irradiated.

In the case that the first switching transistor M1 is turned off and the photodiode is irradiated with the light beams reflected by the valleys and ridges of the fingerprint, the potential at the node G may be increased, such that the voltage $V_G$ applied to the node G satisfies: $V_G = V_{data} + V_{th} + \Delta S$.

Step 305: enabling the second switching transistor to be turned on under the control of the scanning signal end Scan, so as to enable the voltage following transistor M0 to be turned on for the second time and turn on the current source CO, thereby to enable the second electrode of the voltage following transistor M0 to output a voltage signal independent of the threshold voltage of the voltage following transistor M0 to the signal output end Vout.

In Step 104, the potential $V_G$ at the node G may be increased, so the voltage following transistor M0 may be turned on again due to the fact that that the turn-on condition of the voltage following transistor M0 has been met again. In addition, the second switching transistor M2 may be turned on under the control of the scanning of the gate scanning signal from the IC. Hence, the current source CO, the voltage following transistor M0 and the second switching transistor M2 may form a conductive path. At this time, a voltage signal $V_S$ may be outputted from the first electrode of the voltage following transistor M0. On the basis of the formulae $V_G - V_S \approx V_{th} + K_2$ and $(V_{data} + V_{th} + \Delta S) - V_S \approx V_{th} + K_2$, it may be deduced that $V_S \approx V_{data} + \Delta S - K_2$, where $K_2$ is a constant. Hence, the voltage signal $V_S$ from the first electrode of the voltage following transistor M0 is merely related to the potential change $\Delta S$ at the node G, but independent of the threshold voltage $V_{th}$ of the voltage following transistor M0. As a result, it is able to eliminate the influence caused by a threshold voltage drift of the voltage following transistor M0, prevent the occurrence of a drift for output data from the fingerprint detection circuit, and increase a signal-to-noise ratio of the output signal, thereby to enable the fingerprint detection circuit to detect the fingerprint normally.

According to the detection method for the fingerprint detection circuit in the embodiments of the present disclosure, in the fingerprint detection circuit, the gate electrode of the first switching transistor is connected to the first resetting control end, the first electrode thereof is connected to the node, and the second electrode thereof is connected to the second electrode of the voltage following transistor. The gate electrode of the second switching transistor is connected to the scanning signal end of the fingerprint detection circuit, the first electrode thereof is connected to the second electrode of the voltage following transistor, and the second electrode thereof is connected to the first reference voltage end. The gate electrode of the voltage following transistor is connected to the node, and the first electrode thereof is connected to the signal output end of the fingerprint detection circuit and connected to the second reference voltage end via the current source. The first electrode of the photosensitive unit is connected to the third reference voltage end, and the second electrode thereof is connected to the node. In the case that the voltage following transistor is the N-channel transistor, the first switching transistor is turned on, the second switching transistor is turned off and the predetermined voltage is applied to the first electrode of the voltage following transistor, it is able to turn on the voltage following transistor, and enable the node to charge the first electrode of the voltage following transistor through the first switching transistor, such that the voltage applied to the node is reset to a value related to the threshold voltage of the voltage following transistor. As a result, it is able to output, through the first electrode of the voltage following transistor, a voltage signal independent of the threshold voltage of the voltage following transistor, provide an ideal following effect for the voltage following transistor, prevent the occurrence of the drift for the output data from the fingerprint detection circuit and increase the signal-to-noise ratio of the output signal, thereby to enable the fingerprint detection circuit to detect the fingerprint normally.

It should be appreciated that, in the case that the voltage following transistor is the N-channel transistor, the fingerprint detection circuit may further include the above-mentioned third switching transistor, the fourth switching transistor and/or the fifth switching transistor, so as to achieve the above-mentioned corresponding functions. The structure and principle of such fingerprint detection circuit are similar to those mentioned above, and thus will not be particularly defined herein.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure. A protection scope of the present application is defined by the attached claims.

What is claimed is:

1. A fingerprint detection circuit, comprising a scanning signal end, a signal output end, a photosensitive unit, a voltage following transistor, a first switching transistor and a second switching transistor, wherein:
    a gate electrode of the first switching transistor is connected to a first resetting control end, a first electrode of the first switching transistor is connected to a node, and a second electrode of the first switching transistor is connected to a second electrode of the voltage following transistor;
    a gate electrode of the second switching transistor is connected to the scanning signal end, a first electrode of the second switching transistor is connected to the second electrode of the voltage following transistor, and a second electrode of the second switching transistor is connected to a first reference voltage end;
    a gate electrode of the voltage following transistor is connected to the node, and a first electrode of the voltage following transistor is connected to the signal output end and connected to a second reference voltage end via a current source; and
    a first electrode of the photosensitive unit is connected to a third reference voltage end, and a second electrode of the photosensitive unit is connected to the node.

2. The fingerprint detection circuit according to claim 1, further comprising:
    a third switching transistor, wherein a gate electrode of the third switching transistor is connected to a second resetting control end, a first electrode of the third switching transistor is connected to a fourth reference voltage end, and a second electrode of the third switching transistor is connected to the node.

3. The fingerprint detection circuit according to claim 1, further comprising:
    a fourth switching transistor, wherein a gate electrode of the fourth switching transistor is connected to a third resetting control end, a second electrode of the fourth switching transistor is connected to the first electrode of the voltage following transistor, the first electrode of the voltage following transistor is connected to the signal output end via a first electrode of the fourth switching transistor, and the first electrode of the fourth switching transistor serves as the first electrode of the voltage following transistor.

4. The fingerprint detection circuit according to claim 1, further comprising:
    a fifth switching transistor, wherein a gate electrode of the fifth switching transistor is connected to a fourth resetting control end, a first electrode of the fifth switching transistor is connected to the first electrode of the voltage following transistor, and a second electrode of the fifth switching transistor is connected to a fifth reference voltage end.

5. The fingerprint detection circuit according to claim 2, further comprising:
a fourth switching transistor, wherein a gate electrode of the fourth switching transistor is connected to a third resetting control end, and a second electrode of the fourth switching transistor is connected to the first electrode of the voltage following transistor, the first electrode of the voltage following transistor is connected to the signal output end via a first electrode of the fourth switching transistor, and the first electrode of the fourth switching transistor serves as the first electrode of the voltage following transistor.

6. The fingerprint detection circuit according to claim 2, further comprising:
a fifth switching transistor, wherein a gate electrode of the fifth switching transistor is connected to a fourth resetting control end, a first electrode of the fifth switching transistor is connected to the first electrode of the voltage following transistor, and a second electrode of the fifth switching transistor is connected to a fifth reference voltage end.

7. The fingerprint detection circuit according to claim 3, further comprising:
a fifth switching transistor, wherein a gate electrode of the fifth switching transistor is connected to a fourth resetting control end, a first electrode of the fifth switching transistor is connected to the first electrode of the voltage following transistor, and a second electrode of the fifth switching transistor is connected to a fifth reference voltage end.

8. A fingerprint sensor, comprising the fingerprint detection circuit according to claim 1.

9. The fingerprint sensor according to claim 8, wherein the fingerprint detection circuit further comprises:
a third switching transistor, wherein a gate electrode of the third switching transistor is connected to a second resetting control end, a first electrode of the third switching transistor is connected to a fourth reference voltage end, and a second electrode of the third switching transistor is connected to the node.

10. The fingerprint sensor according to claim 8, wherein the fingerprint detection circuit further comprises:
a fourth switching transistor, wherein a gate electrode of the fourth switching transistor is connected to a third resetting control end, a second electrode of the fourth switching transistor is connected to the first electrode of the voltage following transistor, the first electrode of the voltage following transistor is connected to the signal output end via a first electrode of the fourth switching transistor, and the first electrode of the fourth switching transistor serves as the first electrode of the voltage following transistor.

11. The fingerprint sensor according to claim 8, wherein the fingerprint detection circuit further comprises:
a fifth switching transistor, wherein a gate electrode of the fifth switching transistor is connected to a fourth resetting control end, a first electrode of the fifth switching transistor is connected to the first electrode of the voltage following transistor, and a second electrode of the fifth switching transistor is connected to a fifth reference voltage end.

12. A fingerprint sensor, comprising a plurality of pixel units arranged in an array form, wherein each of the pixel units comprises the fingerprint detection circuit according to claim 1.

13. The fingerprint sensor according to claim 12, wherein the fingerprint detection circuit further comprises:
a third switching transistor, wherein a gate electrode of the third switching transistor is connected to a second resetting control end, a first electrode of the third switching transistor is connected to a fourth reference voltage end, and a second electrode of the third switching transistor is connected to the node.

14. The fingerprint sensor according to claim 12, wherein the fingerprint detection circuit further comprises:
a fourth switching transistor, wherein a gate electrode of the fourth switching transistor is connected to a third resetting control end, a second electrode of the fourth switching transistor is connected to the first electrode of the voltage following transistor, the first electrode of the voltage following transistor is connected to the signal output end via a first electrode of the fourth switching transistor, and the first electrode of the fourth switching transistor serves as the first electrode of the voltage following transistor.

15. The fingerprint sensor according to claim 12, wherein the fingerprint detection circuit further comprises:
a fifth switching transistor, wherein a gate electrode of the fifth switching transistor is connected to a fourth resetting control end, a first electrode of the fifth switching transistor is connected to the first electrode of the voltage following transistor, and a second electrode of the fifth switching transistor is connected to a fifth reference voltage end.

16. A detection method for use in the fingerprint detection circuit according to claim 1, wherein the voltage following transistor is a P-channel transistor, and the detection method comprises:
enabling the first switching transistor to be turned on under the control of the first resetting control end;
enabling the second switching transistor to be turned off under the control of the scanning signal end;
applying a first predetermined voltage to the first electrode of the voltage following transistor, wherein the first predetermined voltage is greater than a sum of a voltage applied to the node and a threshold voltage of the voltage following transistor, to enable the voltage following transistor to be turned on for a first time, and enable the first electrode of the voltage following transistor to charge the node via the first switching transistor until the voltage following transistor is turned off and the voltage applied to the node is equal to a difference between the first predetermined voltage and the threshold voltage of the voltage following transistor;
enabling the first switching transistor to be turned off under the control of the first resetting control end, to enable the voltage applied to the node to be reduced by irradiating the photosensitive unit; and
enabling the second switching transistor to be turned on under the control of the scanning signal end, to enable the voltage following transistor to be turned on for the second time and enable the current source to be turned on, to enable the second electrode of the voltage following transistor to output a voltage signal independent of the threshold voltage of the voltage following transistor to the signal output end.

17. The detection method according to claim 16, wherein the fingerprint detection circuit further comprises a third switching transistor, a gate electrode of the third switching transistor is connected to the second resetting control end, a first electrode of the third switching transistor is connected to the fourth reference voltage end, and a second electrode of the third switching transistor is connected to the node, and wherein, prior to the step of enabling the first switching transistor to be turned on under the control of the first resetting control end, the detection method further comprises:

enabling the third switching transistor to be turned on under the control of the second resetting control end, to enable the voltage applied to the node to be equal to a reference voltage outputted from the fourth reference voltage end, wherein the reference voltage outputted from the fourth reference voltage end is smaller than a difference between the first predetermined voltage and the threshold voltage of the voltage following transistor.

18. The detection method according to claim 16, wherein the fingerprint detection circuit further comprises a fourth switching transistor, a gate electrode of the fourth switching transistor is connected to the third resetting control end, and a second electrode of the fourth switching transistor is connected to the first electrode of the voltage following transistor, the first electrode of the voltage following transistor is connected to the signal output end via a first electrode of the fourth switching transistor, and the first electrode of the fourth switching transistor serves as the first electrode of the voltage following transistor, and wherein:

subsequent to the step of enabling the first switching transistor is turned on under the control of the first resetting control end, the detection method further comprises: enabling the fourth switching transistor to be turned on under the control of the third resetting control end, subsequent to the step of applying the first predetermined voltage to the first electrode of the voltage following transistor, wherein the first predetermined voltage is greater than the sum of the voltage applied to the node and the threshold voltage of the voltage following transistor, to enable the voltage following transistor to be turned on for the first time, and enable the first electrode of the voltage following transistor to charge the node via the first switching transistor until the voltage following transistor is turned off and the voltage applied to the node is equal to the difference between the first predetermined voltage and the threshold voltage of the voltage following transistor, the detection method further comprises: enabling the fourth switching transistor to be turned off under the control of the third resetting control end, and the step of enabling the second switching transistor to be turned on under the control of the scanning signal end, to enable the voltage following transistor to be turned on for the second time and enable the current source to be turned on, to enable the second electrode of the voltage following transistor to output the voltage signal independent of the threshold voltage of the voltage following transistor to the signal output end, comprises: subsequent to enabling the second switching transistor to be turned on for a predetermined time period under the control of the scanning signal end, enabling the fourth switching transistor to be turned on under the control of the third resetting control end, to enable the voltage following transistor to be turned on for the second time and enable the current source to be turned on, to enable the second electrode of the voltage following transistor to output the voltage signal independent of the threshold voltage of the voltage following transistor to the signal output end.

19. The detection method according to claim 16, wherein the fingerprint detection circuit further comprises a fifth switching transistor, a gate electrode of the fifth switching transistor is connected to the fourth resetting control end, a first electrode of the fifth switching transistor is connected to the first electrode of the voltage following transistor, and a second electrode of the fifth switching transistor is connected to the fifth reference voltage end, and wherein:

the step of applying the first predetermined voltage to the first electrode of the voltage following transistor, wherein the first predetermined voltage is greater than the sum of the voltage applied to the node and the threshold voltage of the voltage following transistor, to enable the voltage following transistor to be turned on for the first time, and enable the first electrode of the voltage following transistor to charge the node via the first switching transistor until the voltage following transistor is turned off and the voltage applied to the node is equal to the difference between the first predetermined voltage and the threshold voltage of the voltage following transistor, comprises: enabling the fifth switching transistor to be turned on under the control of the fourth resetting control end, wherein a reference voltage outputted from the fifth reference voltage end is equal to the first predetermined voltage, to enable the voltage following transistor to be turned on for the first time, and enable the first electrode of the voltage following transistor to charge the node via the first switching transistor until the voltage following transistor is turned off and the voltage applied to the node is equal to the difference between the first predetermined voltage and the threshold voltage of the voltage following transistor.

20. A detection method for use in the fingerprint detection circuit according to claim 1, wherein the voltage following transistor is an N-channel transistor, and the detection method comprises:

enabling the first switching transistor to be turned on under the control of the first resetting control end;

enabling the second switching transistor to be turned off under the control of the scanning signal end;

applying a second predetermined voltage to the first electrode of the voltage following transistor, wherein the second predetermined voltage is smaller than a sum of a voltage applied to the node and a threshold voltage of the voltage following transistor, to enable the voltage following transistor to be turned on for the first time, and enable the node to charge the first electrode of the voltage following transistor via the first switching transistor until the voltage following transistor is turned off and the voltage applied to the node is equal to a sum of the second predetermined voltage and the threshold voltage of the voltage following transistor;

enabling the first switching transistor to be turned off under the control of the first resetting control end, and enabling the voltage applied to the node to be increased by irradiating the photosensitive unit; and enabling the second switching transistor to be turned on under the control of the scanning signal end, to enable the voltage following transistor to be turned on for the second time and enable the current source to be turned on, to enable the second electrode of the voltage following transistor to output a voltage signal independent of the threshold voltage of the voltage following transistor to the signal output end.

\* \* \* \* \*